United States Patent [19]

Grünewald et al.

[11] Patent Number: 4,897,607

[45] Date of Patent: Jan. 30, 1990

[54] METHOD AND DEVICE FOR DETECTING AND LOCALIZING FAULTS IN ELECTRICAL INSTALLATIONS

[75] Inventors: Peter Grünewald, Essen-Haarzopf; Kurt Fork, Neunkirchen; Jürgen Weidner, Essen-Überruhr; Reinhold Koziel, Mülheim/Ruhr, all of Fed. Rep. of Germany

[73] Assignee: Siemens Aktiengesellschaft, Berlin and Munich, Fed. Rep. of Germany

[21] Appl. No.: 37,619

[22] Filed: Apr. 13, 1987

[30] Foreign Application Priority Data

Apr. 14, 1986 [DE] Fed. Rep. of Germany ..... 36124475

[51] Int. Cl.⁴ ............................................. G01R 31/34
[52] U.S. Cl. ..................................... 324/512; 324/536; 324/545; 324/546; 324/158 MG
[58] Field of Search ............... 324/512, 511, 520, 521, 324/536, 545, 546, 547, 158 MG

[56] References Cited

U.S. PATENT DOCUMENTS

| | | | |
|---|---|---|---|
| H,000,536 | 10/1988 | Strickland | 324/536 X |
| 3,753,087 | 8/1973 | Tan | 324/546 X |
| 3,801,899 | 4/1974 | Liao | 324/536 |
| 4,095,173 | 6/1978 | Darrel | 324/547 X |
| 4,147,982 | 4/1979 | Emery | 324/545 X |

OTHER PUBLICATIONS

Brambilla et al, "An Instrument for Measuring Energy Related to Partial Discharges in Insulation Systems", Alta Frequenza, vol. XLIII, N.S. Maggio, 1974, pp. 243-249.

Reynolds et al., Power System Instrumentation and Measurement Committee, "A New Method of Monitoring the Integrity of Insulation of In-Service Three Phase High Voltage Apparatus", Apr. 1979, pp. 420-428.

Publication "Elektrotechnische Zeitschrift etz-a", vol. 97, (1976), No. 11, pp. 657 to 663.
Patent Abstracts of Japan, vol. 7, No. 256 (P-236), Nov. 15, 1983.
Publication Siemens Power Engineering & Automation, vol. 7, No. 1, Jan./Feb. 1985, pp. 26-29.
Publication I.S.A. Transactions, vol. 11, No. 2, 1973, pp. 168-177.
Publication Siemens Power Engineering & Automation, vol. 7, No. 4, Jul./Aug. 1985, pp. 285-290.
Publication Proceedings, International Conference on Electrical Machines, Sep. 1984.
Publication IEEE Electrical Insulation Magazine, Mar. 1986, vol. 2, No. 2, pp. 18-24.

Primary Examiner—Reinhard J. Eisenzopf
Assistant Examiner—Robert W. Mueller
Attorney, Agent, or Firm—Herbert L. Lerner; Laurence A. Greenberg

[57] ABSTRACT

A method and device for detecting and localizing fault in electrical installations includes performing partial discharge measurements and high-frequency measurements at least at one location in the electrical installation and optionally in all phases, selectively comparing the measurement values with each other and with calibration signals, drawing conclusions from the measurements regarding the location and the type of the fault, selectively continuously and periodically performing the measurements at least at three measuring points while the installation is in operation, simulating the electrical installation in a computer as a high-frequency network, while simulating fault with the signals originating therefrom at the measuring points, comparing any measurement values which indicate fault with the simulated signal values for different fault types and fault locations, and determining the type and location of the fault from the simulated signal values which best agree with the measurement values and from the corresponding simulated fault.

15 Claims, 4 Drawing Sheets

METHOD AND DEVICE FOR DETECTING AND LOCALIZING FAULTS IN ELECTRICAL INSTALLATIONS

The invention relates to a method for detecting and localizing faults in electrical installations, especially generators or power generating station blocks, wherein partial discharge measurements and high-frequency measurements are carried out at one or more locations in the electrical installation and possibly for all phases, and the measurement values are compared with each other or with calibration signals, and conclusions are drawn therefrom regarding the location and the type of the fault. The invention also relates to devices for carrying out the method.

A method of this type is known from a technical article by H. Nieschwietz and W. Stein in "Elektrotechnische Zeitschrift etz-a", Volume 97 (1976). No. 11. Pages 657 to 663. on which the present invention is based. According to the article, the method is used as a means of quality control in high-voltage transformers. In the article, electrical partial-discharge measurements and sound measurements are described as alternative methods. Furthermore, methods and apparatus for partial-discharge measurement or high-frequency output coupling and ultrasonic monitoring are known from U.S. application Ser. No. PCT DE 85/00527, filed Dec. 16, 1985 Ser. No. 940,543, filed Dec. 11, 1986; and Ser. No. 001,344, filed Jan. 8, 1987, to which reference is expressly made herein. In order to avoid duplications, reference is therefore made to these two applications for details of the measurements.

It is accordingly an object of the invention to provide a method and device for detecting and localizing fault in electrical installations, which overcomes the hereinafore-mentioned disadvantages of the heretofore-known methods and devices of this general type and to provide a method and apparatus for the global monitoring of the operation of electrical installations, especially generators and power generating station blocks, which is to permit early detection of fault and in particular a diagnosis and localization of the fault. Furthermore, retrofitting of power generating station blocks with the device for carrying out the method according to the invention is to be made possible by providing measuring points which are particularly well suited for this purpose and can be set up without extensive modification measures.

With the foregoing and other objects in view there is provided, in accordance with the invention, a method for detecting and localizing fault in electrical installations, which comprises:

(a) performing partial discharge measurements and high-frequency measurements at least at one location in the electrical installation and optionally in all phases;

(b) selectively comparing the measurement values with each other and with calibration signals;

(c) drawing conclusions from the measurements regarding the location and the type of the fault:

(d) selectively continuously and periodically performing the measurements at least at three measuring points while the installation is in operation:

(d) simulating the electrical installation in a computer as a high-frequency network, while simulating faults with the signals originating therefrom at the measuring points;

(e) comparing any measurement values which indicate faults with the simulated signal values for different fault types and fault locations; and (f) determining the type and location of the fault from the simulated signal values which best agree with the measurement values and from the corresponding simulated fault.

Contrary to the methods known from the state of the art, these measuring signals are to be evaluated not only by comparison with calibration signals, but the entire electrical installation is to be simulated in a computer as a high-frequency network, which also permits the simulation of fault and the tracing of the signals generated by this fault through the entire network. In modern computer installations it is possible to simulate networks and the input of signals at any desired point in such networks and to trace the signal paths and the changes of the signals occurring during the process, in a conventional manner. A very accurate diagnosis of the type and the location of the fault can thus be accomplished through comparison of the measuring signals with simulated signals: the quality of the diagnosis naturally increases with the number of measuring values obtained.

In accordance with another mode of the invention, there is provided a method which comprises performing the measurement value comparing step with respect to frequency spectrum.

In accordance with a further mode of the invention, there is provided a method which comprises performing the measurement value comparing step with respect to propagation time.

In accordance with an added mode of the invention, there is provided a method which comprises performing the measurement value comparing step with respect to amplitude.

In accordance with an additional mode of the invention, there is provided a method which comprises performing the measurement value comparing step with respect to phase.

In accordance with again another mode of the invention, there is provided a method which comprises performing at least three of the measurements listed below during operation:

(a) performing high-frequency output coupling with capacitive dividers of high-voltage feedthroughs of transformers:

(b) performing high-frequency output coupling with high-frequency impedances in conjunction with coupling quadrupoles as subdividers to existing network protection capacitors:

(c) performing high-frequency output coupling with capacitive or inductive coupling within a generator using wires near switching lines;

(d) performing high-frequency output coupling with high-frequency current transformers through a Y-point lead or a capacitive divider between a Y-point and ground:

(e) performing high-frequency output coupling with high-frequency current transformers through a separate grounding line of a stator lamination stack:

(f) performing high-frequency output coupling capacitively with a generator shaft and exciter bearings, and optionally with an additional antenna coupling:

(g) performing high-frequency output coupling through capacitive use of a cable grounding sheathing or ohmic divider with a high-frequency characteristic on an internal consumption voltage level;

(h) performing high-frequency output coupling through a capacitive or metallic or ohmic tie in a generator protection device.

In accordance with again a further mode of the invention, there is provided a method which comprises comparing the measurement values of three phases with each other for localizing the phase concerned.

In accordance with again an added mode of the invention, there is provided a method which comprises comparing the measuring points with each other and optionally while separated by phase.

In accordance with again an additional mode of the invention, there is provided a method which comprises analyzing interference signals of the different measuring points on an oscilloscope screen as to at least one of amplitude, shape and phase.

In accordance with yet another mode of the invention, there is provided a method which comprises analyzing interference signals of the different measuring points with transient recorders as to at least one of amplitude, shape and phase.

In accordance with yet a further mode of the invention, there is provided a method which comprises concurrently monitoring and utilizing measuring values of sound measuring pickups and including them in the analysis of the fault.

With the objects of the invention in view there is also provided a device for detecting and localizing faults in a power station block including components, comprising at least three operational measuring points for high-frequency output coupling; and at least one of the following means:

means for performing partial discharge measurements and high-frequency measurements at least at one of the operational measuring points and optionally in all phases:

means for selectively comparing the measurement values with each other and with calibration signals:

means for drawing conclusions from the measurements regarding the location and the type of the fault;

means for selectively continuously and periodically performing the measurements at the at least three measuring points while the installation is in operation;

means for simulating the electrical installation in a computer as a high-frequency network, while simulating fault with the signals originating therefrom at the measuring points;

means for comparing any measurement values which indicate fault with the simulated signal values for different faults and fault locations; and means for determining the type and location of the fault from the simulated signal values which best agree with the measurement values and from the corresponding simulated faults.

In accordance with yet an added feature of the invention, the components include a generator at which the operational measuring points are disposed.

In accordance with yet an additional feature of the invention, there are provided operational measuring devices in the form of ultrasonic pickups.

In accordance with still another feature of the invention, the components include a stator winding having a cooling device with a water collector ring at which the ultrasonic pickups are disposed.

In accordance with still a further feature of the invention, the components include internal consumption transformers at which the ultrasonic pickups are disposed.

In accordance with a concomitant feature of the invention, the components include a machine at which the ultrasonic pickups are disposed.

Other features which are considered as characteristic for the invention are set forth in the appended claims.

Although the invention is illustrated and described herein as embodied in a method and device for detecting and localizing fault in electrical installations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
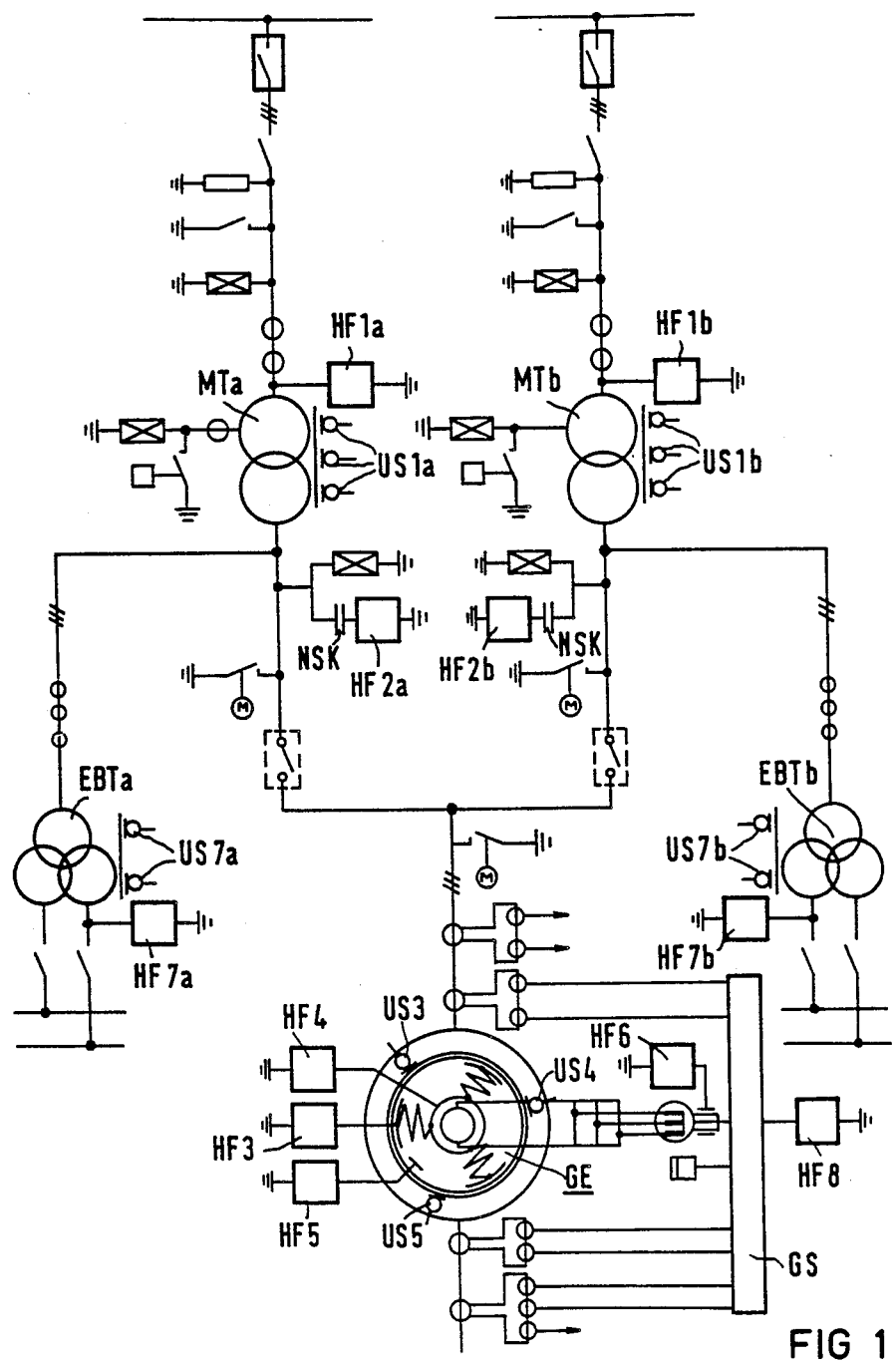
FIG. 1 is a diagrammatic and schematic circuit diagram of a prior art power station block with measuring points for coupling-out high-frequency signals and sound signals.

Referring now to the figures of the drawings in detail and first, particularly, to FIG. 1 thereof, there is seen a diagrammatic and schematic circuit diagram of a power station block, the details which are known from the state of the art and are of no importance for the invention and therefore are not designated specifically. The essential components are a generator GE, a generator protection device GS, two machine transformers MT a, MT b, two internal-consumption transformers EBT a, EBT b and network protection capacitors NSK. According to apparatus which are known or are contained in the not yet published above-mentioned patent applications, the above-mentioned components of the power station block are equipped with sound pickups, particularly for ultrasonic signals. The machine transformers MT a and MT b, each have three respective sound pickups US 1a and US 1b, while the internal consumption transformers EBT a and EBT b are each equipped with two respective sound pickups US 7a and US 7b, for instance. Furthermore, three sound pickups US 3, US 4, US 5 are disposed in each front and rear water collector ring of the generator GE, for instance (as is better visible in FIG. 2). All of the sound pickups together form a branch of the proposed operating monitoring system, which permits the detection and partial localization of fault due to sound signals.

According to the invention it is additionally proposed to equip the power station block with at least three and preferably considerably more measuring points for coupling of high-frequency (HF). Such measuring points may be formed in particular for the following devices:

(a) HF 1a, HF 1b: Capacitive dividers of the high-voltage feedthroughs of the machine transformers MT a, MT b:

(b) HF 2a, HF 2b: High-frequency impedances in conjunction with coupling quadrupoles as subdividers to the existing network protection capacitors NSK:

(c) HF 3: Capacitive HF 3.1 or inductive HF 3.2 coupling within the generator, by means of wires near the switching lines, by grounding electrodes or additional coupling capacities;

(d) HF 4: High-frequency current transformers through a Y-point feed HF 4.1 or capacitive divider HF 4.2 at the Y-point to ground;

(e) HF 5: High-frequency current transformer through a separate grounding line of the stator lamination stack;

(f) HF 6: Capacitive output coupling through a generator shaft and exciter bearing, optionally with an additional antenna coupling;

(g) HF 7 a: Capacitive output coupling, utilizing the
HF 7 b: cable ground coating or by ohmic dividers with a high-frequency characteristic at the internal consumption voltage level;

(h) HF 8: Capacitive or metallic (ohmic) tie in the generator protection device GS.

Figure 2:
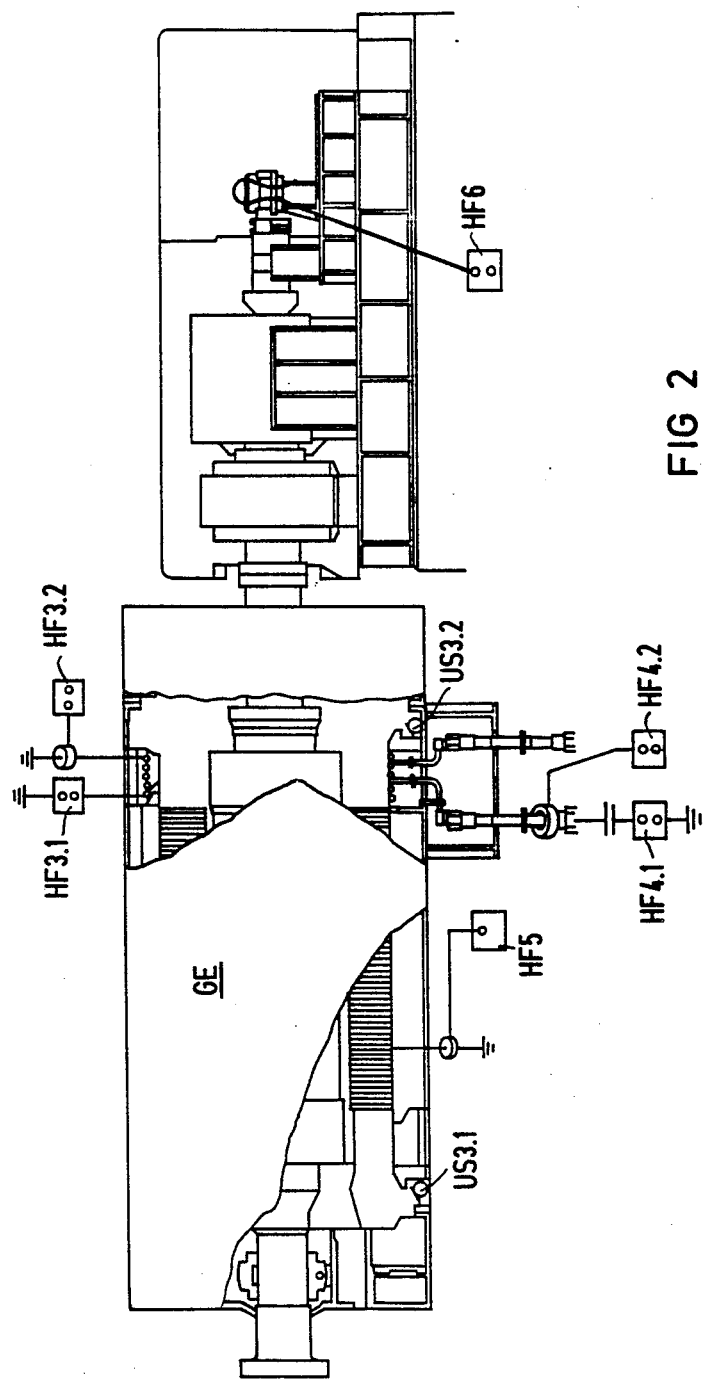
FIG. 2 is a diagrammatic, partially broken-away, longitudinal-sectional view of a turbo generator with exciter devices.

FIG. 2 is an axial, longitudinal-sectional view of a turbo generator GE with an exciter device, by means of which the physical placement of the measuring points shown in diagram form in FIG. 1, is illustrated. Parts of the turbo generator which are conventional and are of no significance for the present invention will not be explained in detail. The location of sound pickups in the forward or rear water collector rings of the generator GE can be seen, with only one of each three pickups in each water collector ring being indicated diagrammatically. In the forward water collector ring, this is the pickup US 3.2; in the rear water collector ring, the pickup US 3.1. In addition, several of the measuring points shown in FIG. 1 are shown in FIG. 2 for the high-frequency output coupling with the diagrammatically shown construction thereof. As shown, a high-frequency lead-out by means of a capacitive HF 3.1 coupling or an inductive HF 3.2 coupling within the generator is possible using wires near the switching lines and specifically by means of grounding electrodes or additional coupling capacities. Coupling to the switching lines permits a particularly advantageous measuring point to be provided. Furthermore, an output point is indicated by high-frequency current transformers through a Y-point lead HF 4.1 or a capacitive divider at the Y-point against ground HF 4.2. A further particularly advantageous measuring point HF 5 is obtained by a high-frequency current transformer through a separate grounding line connected to the stator laminations. A further measuring point HF 6 according to U.S. application Ser. No. 940,543, filed Dec. 11, 1986, permits capacitive output coupling through the generator shaft and the exciter bearings.

Figure 3:
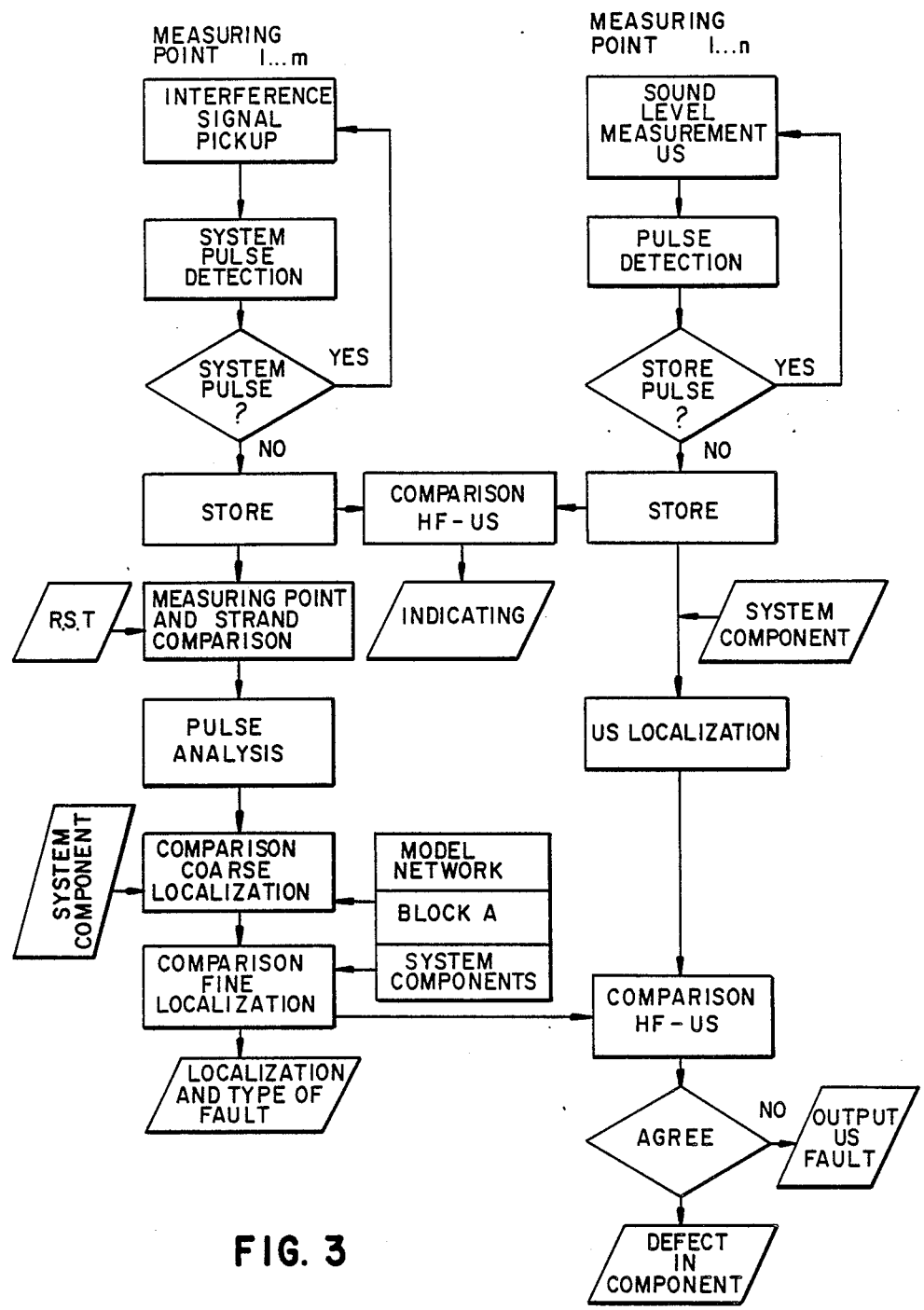
FIG. 3 and 4 are flow diagrams for processing and evaluating measuring signals.
Figure 4:
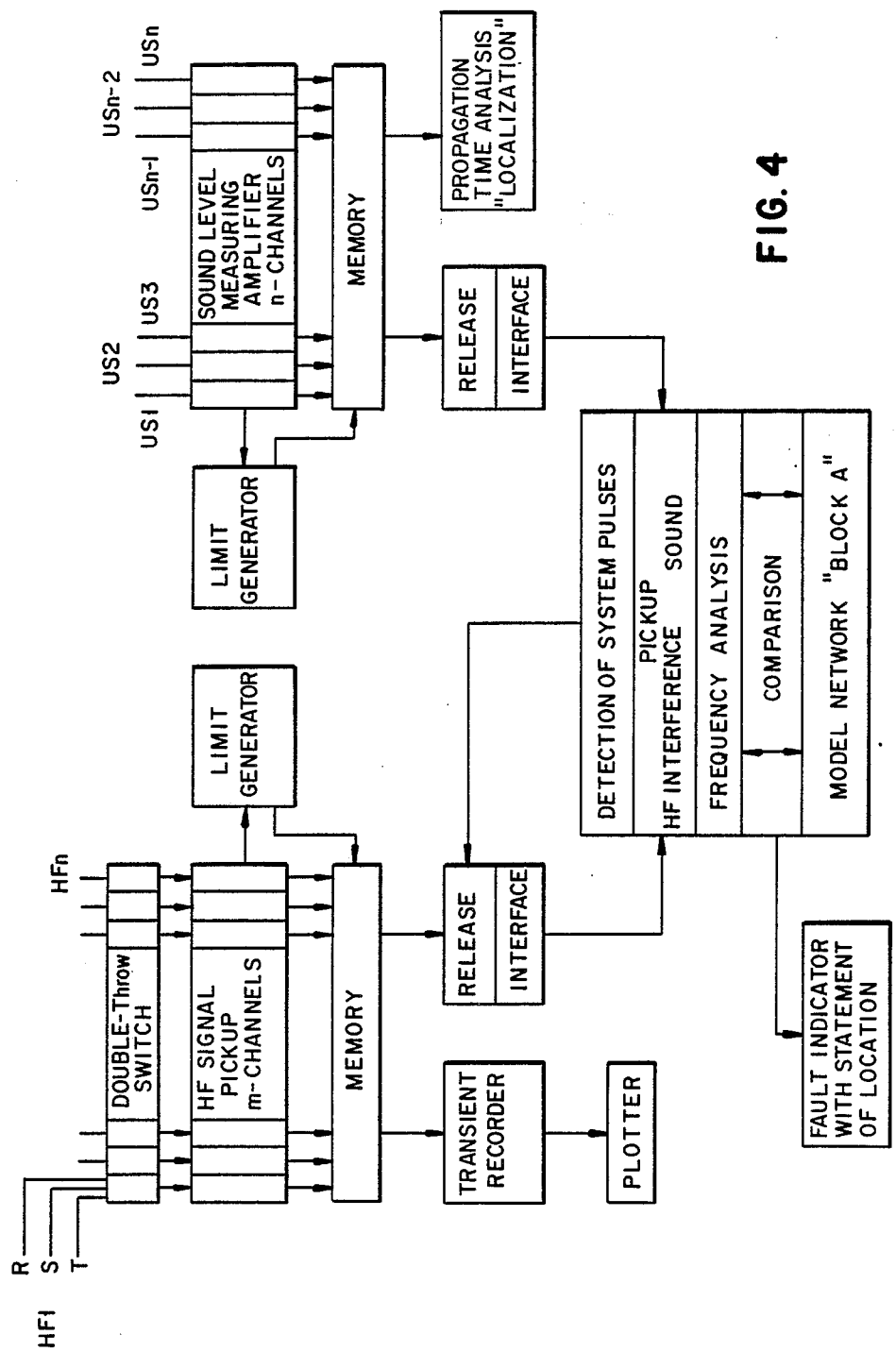

The evaluation of the operational measuring signals that are obtained is shown schematically by reference to the flow diagrams in FIGS. 3 and 4. It is assumed in this case that m measuring points for high-frequency signals and n measuring points for sound signals are provided in the electrical installation. High-frequency signals (HF) as well as sound signals (US) are first checked as to whether or not the signals stem from trouble-free operation of the installation. Such signals are of no importance for monitoring and are not processed further. Abnormal signals, however, are passed on, stored and processed for further analysis. Initially, a comparison between the HF and the US signals can be utilized for a first plausibility examination. During the further processing of the HF signals, the defective phase can first be determined by comparison of the measuring signals from different phases. Determination of the installation components concerned is usually possible by utilizing the sound signals. After this coarse localization, a fine analysis can be carried out with the aid of a simulated fault in a model network of the power station block or the component concerned. This fine analysis then furnishes a diagnosis with statements regarding the type of fault and the location of the fault. A comparison with the diagnosis obtained from the sound signals is also possible in this stage. Discrepancies that may still be present, can likewise be indicated, printed out or stored at this stage.

FIG. 4 illustrates further details of the evaluation. First, it is indicated that with HF and US signals, a respectively larger number of measuring points and measuring values may be involved. The measuring points for high-frequency signals are also partially constructed in this case for three respective phases R, S, T. A preselection of the required signals is made by limit transmitters, wherein signals which exceed presettable limits are stored and analyzed further. An analysis for detecting system pulses is again made, i.e. an analysis of pulses which do not indicate a disturbance but ordinary operation of the installation. As already explained, detected interference pulses are compared with simulated signals and the result is printed out or displayed. In addition, an investigation by transient recorders and the like is possible with a printout of the pictures obtained. In the case of the sound signals, localization by pure propagation time analysis is also possible in the conventional manner.

The present invention is particularly well suited for the early detection of disturbances in electrical installations which manifest themselves by partial discharges or contact breakdown sparks and the like.

The foregoing is a description corresponding in substance to German Application No. P 36 12 475.3, dated Apr. 14, 1986, the International priority of which is being claimed for the instant application, and which is hereby made part of this application. Any material discrepancies between the foregoing specification and the aforementioned corresponding German application are to be resolved in favor of the latter.

We claim:

1. Method for detecting and localizing faults in electrical installations, which comprises:
    (a) performing partial discharge measurements and high frequency measurements at least at one location in the electrical installation and optionally in all phases;
    (b) selectively comparing the measurement values with each other and with calibration signals;
    (c) drawing conclusions from the measurements regarding the location and the type of the fault;
    (d) selectively continuously and periodically performing the measurements at least at three measuring points while the installation is in operation;
    (d) simulating the electrical installation in a computer as a high-frequency network, while simulating faults with the signals originating therefrom at the measuring points;
    (e) comparing any measurement values which indicate faults with the simulated signal values for different fault types and fault locations; and
    (f) determining the type and location of the fault from the simulated signal values which best agree with the measurement values and from the corresponding simulated fault; and concurrently monitoring and utilizing measuring values of sound measuring pickups and including them in the analysis of the fault.

2. Method according to claim 1, which comprises performing the measurement value comparing step with respect to frequency spectrum.

3. Method according to claim 1, which comprises performing the measurement value comparing step with respect to propagation time.

4. Method according to claim 1, which comprises performing the measurement value comparing step with respect to amplitude.

5. Method according to claim 1, which comprises performing the measurement value comparing step with respect to phase.

6. Method according to claim 1, which comprises performing simultaneously at least three of the measurements listed below during operation:
 (a) performing high-frequency output coupling with capacitive dividers of high-voltage feedthroughs of transformers:
 (b) performing high-frequency output coupling with high-frequency impedances in conjunction with coupling quadrupoles as subdividers to existing network protection capacitors:
 (c) performing high-frequency output coupling with capacitive or inductive coupling within a generator using wires near switching lines;
 (d) performing high-frequency output coupling with high-frequency current transformers through a Y-point lead or a capacitive divider between a Y-point and ground:
 (e) performing high-frequency output coupling with high-frequency current transformers through a separate grounding line of a stator lamination stack:
 (f) performing high-frequency output coupling capacitively with a generator shaft and exciter bearings, and optionally with an additional antenna coupling;
 (g) performing high-frequency output coupling through capacitive use of a cable grounding sheathing or ohmic divider with a high-frequency characteristic on an internal consumption voltage level:
 (h) performing high-frequency output coupling through a capacitive or metallic or ohmic tie in a generator protection device.

7. Method according to claim 1, which comprises comparing the measurement values of three phases with each other for localizing the phase concerned.

8. Method according to claim 1, which comprises comparing the measuring points with each other and optionally while separated by phase.

9. Method according to claim 1, which comprises analyzing interference signals of the different measuring points on an oscilloscope screen as to at least one of amplitude, shape and phase.

10. Method according to claim 1, which comprises analyzing interference signals of the different measuring points with transient recorders as to at least one of amplitude, shape and phase.

11. Device for detecting and localizing faults in a power station block including components, comprising at least three operational measuring points for high-frequency output coupling; operational measuring devices in the form of ultrasonic pickups; and
 the following means:
 means for performing partial discharge measurements and high-frequency measurements at least at one of said operational measuring points and optionally in all phases;
 means for selectively comparing the measurement values with each other and with calibration signals;
 means for drawing conclusions from the measurements regarding the location and the type of the fault;
 means for selectively continuously and periodically performing the measurements at said at least three measuring points while the installation is in operation;
 means for simulating the electrical installation in a computer as a high-frequency network, while simulating fault with the signals originating therefrom at the measuring points;
 means for comparing any measurement values which indicate fault with the simulated signal values for different faults and fault locations; and
 means for determining the type and location of the fault from the simulated signal values which best agree with the measurement values and from the corresponding simulated fault.

12. Device according to claim 11, wherein the components include a generator at which said operational measuring points are disposed.

13. Device according to claim 11, wherein the components include a stator winding having a cooling device with a water collector ring at which said ultrasonic pickups are disposed.

14. Device according to claim 11, wherein the components include internal consumption transformers at which said ultrasonic pickups are disposed.

15. Device according to claim 11, wherein the components include a machine at which said ultrasonic pickups are disposed.

* * * * *